US006935269B2

(12) United States Patent
Lee et al.

(10) Patent No.: US 6,935,269 B2
(45) Date of Patent: Aug. 30, 2005

(54) APPARATUS FOR TREATING THE SURFACE WITH NEUTRAL PARTICLE BEAMS

(75) Inventors: Bong-Ju Lee, Taejeon-si (KR); Suk-Jae Yoo, Taejeon-si (KR)

(73) Assignees: Sem Technology Co., Ltd., Seoul (KR); Hag-Joo Lee, Seoul (KR)

(*) Notice: Subject to any disclaimer, the term of this patent is extended or adjusted under 35 U.S.C. 154(b) by 248 days.

(21) Appl. No.: 10/258,775

(22) PCT Filed: Apr. 28, 2001

(86) PCT No.: PCT/KR01/00709
§ 371 (c)(1),
(2), (4) Date: Mar. 4, 2003

(87) PCT Pub. No.: WO01/84611
PCT Pub. Date: Nov. 8, 2001

(65) Prior Publication Data
US 2003/0168011 A1 Sep. 11, 2003

(30) Foreign Application Priority Data
May 2, 2000 (KR) .................................. 2000-23538

(51) Int. Cl.$^7$ .......................... C23C 16/00; C24F 1/00; H01L 21/306
(52) U.S. Cl. .......................... 118/723 I; 118/723 AN; 118/724; 156/345.37; 156/348.48
(58) Field of Search .................. 156/345.48, 345.37; 118/723 AN, 723 I, 724

(56) References Cited

U.S. PATENT DOCUMENTS

| 4,662,977 | A | | 5/1987 | Motley et al. |
| 4,891,095 | A | | 1/1990 | Ishida et al. |
| 5,282,899 | A | | 2/1994 | Balmashnov et al. |
| 5,468,955 | A | | 11/1995 | Chen et al. |
| 5,690,050 | A | * | 11/1997 | Doi ...................... 118/723 MP |
| 5,792,261 | A | * | 8/1998 | Hama et al. .............. 118/723 I |
| 6,132,552 | A | * | 10/2000 | Donohoe et al. ...... 156/345.33 |
| 6,162,323 | A | * | 12/2000 | Koshimizu ............. 156/345.26 |
| 6,326,597 | B1 | * | 12/2001 | Lubomirsky et al. ....... 219/494 |

FOREIGN PATENT DOCUMENTS

JP          62-185324         8/1987

* cited by examiner

Primary Examiner—Parviz Hassanzadeh
Assistant Examiner—Karla Moore
(74) Attorney, Agent, or Firm—Bachman & LaPointe, P.C.

(57) ABSTRACT

The present invention relates to an apparatus for treating the surface with neutral particle beams comprising an antenna container, a plasma generating part, a neutral particle beam generating part and a treating part, wherein the antenna container comprises antennas connected to high frequency electric power supply through which high frequency electric power supplies, the plasma generating part transfers gases from a gas injector into plasmas with the supplied power, the neutral particle beam generating part reverts the obtained plasmas to neutral particle beams via the collision thereof with metal plates, and the treating part treats the surface of a target with the neutral particle beams.

11 Claims, 4 Drawing Sheets

APPARATUS FOR TREATING THE SURFACE WITH NEUTRAL PARTICLE BEAMS

TECHNICAL FIELD OF THE INVENTION

The present invention relates to a semiconductor manufacturing equipment, more specifically, to a semiconductor manufacturing equipment which treats with neutral particle beams the surface of a target such as a wafer or a liquid crystal panel used in the manufacturing process of a semiconductor or a liquid crystal panel.

BACKGROUND OF THE INVENTION

Plasma, which is generated inside a vacuum chamber, is being widely used in unit processes such as dry etching, physical or chemical vapor deposition, sensitizer cleaning, or other surface treatments. In order to generate plasma, there are installed antennas on the upper inside or outside of the plasma chamber and a target holder on the lower portion of the chamber. By supplying the high frequency electric power into upper inside space of the chamber through the antennas, a processing gas inside the chamber is dissociated and the plasma is generated by glow discharge. When the bias voltage applies to the target holder, the generated plasma hits and treats the surface of the target such as wafer.

As semiconductor chips are highly integrated and semiconductor wafers or liquid crystal displays are becoming the larger area, the required conditions on the apparatus for processing the surface of a target are getting stricter and plasma processing apparatus is under the same situation. Many studies and suggestions have been made to improve the efficiency of the plasma processing apparatus. Such studies and suggestions are focused on increasing the density of: plasma in order to reduce the time required for treating a target, and on generating uniformly distributed plasma to treat a target with a larger area. Especially, in terms of increasing the plasma density, the inductively coupled plasma source is widely used. Changing the shape or location of antenna and changing the location through which a processing gas is supplied are attempted to generate the uniform plasma.

In spite of such efforts, plasma processing methods naturally suffered from that plasma is a charged particle, as thus, super-finely treated target can not be obtained. For instance, use of the charged particles for etching often tends to charge the target being etched, which may alter the etch profile, or lead to voltage gradients which may damage the performance of the device formed on the target. Further, the etching reaction by accelerated ions may result in the formation of damaged layers as a result of the dislocation on the surface of a substrate or the formation of deformed surface layers. Therefore, additional treatments such as heat treatment are required to heal such damage.

To overcome such a problem with the plasma processing method, a system using neutral particles instead of plasma is suggested in U.S. Pat. No. 4,662,977 (Title of the invention: neutral particle surface alteration) issued on May 5, 1987. This system produces neutral particles beams by creating plasma with plasma gun and directing the plasma towards an inclined metal plate. Nevertheless, this system is not suitable for treating the surface of a target having 8 inches or more, because of the small cross section of the incident neutral particle beams onto wafers. For the application to the larger target, it is difficult for this system to guarantee the uniformity of the etch profile. Moreover, this system is designed to directly convert atoms or molecules of the active species for etching to plasma, and flux of hyperthermal neutral particle beams from this system is much less than the one from the conventional plasma processing apparatus. Thus, the processing time is very long, thus, not economical.

SUMMARY OF THE INVENTION

It is an object of the present invention, in order to avoid such problems, to provide an apparatus for treating the surface of a target such as a wafer or a liquid crystal panel with neutral particle beams. This and other objects can be accomplished by providing an apparatus that has a wide effective cross section and creates high flux of hyperthermal neutral particle beams.

DETAILED DESCRIPTION OF THE INVENTION

Figure 1:
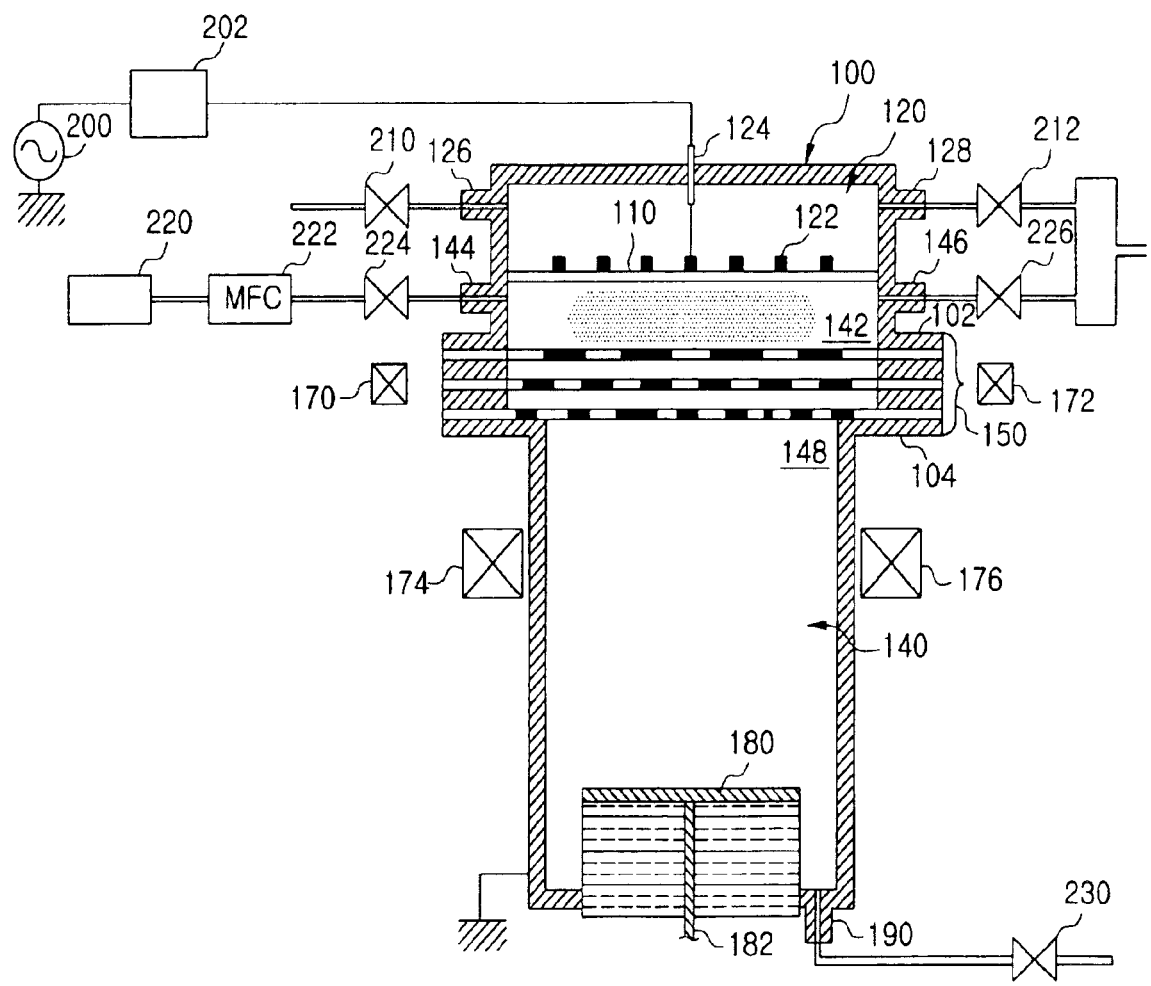
FIG. 1 shows an exemplary embodiment of an etching apparatus according to the present invention.

To achieve the task stated above, there is provided an apparatus comprising a high frequency electric power introducing part, a plasma generating part, a neutral particle beam generating part and a treating part. More specifically, the apparatus comprises an antenna container which comprises antenna connected to high frequency electric power supply through which high frequency electric power supplies, a plasma generating part which transfers gases from a gas injector into plasmas with the supplied power, the neutral particle beam generating part which reverts the obtained plasmas to neutral particle beams via a collision thereof with metal plates, and the treating part which treats the surface of a target with the neutral particle beams.

The antenna container according to the present invention comprises an antenna supporting panel into which looped or spiral high frequency antennas are installed. The antennas are connected to a high frequency power supply through a feeding bar such that high frequency electric power is supplied into a high frequency electric power introducing part. Further, an impedance matching circuit located between the feeding bar and the high frequency power supply allows the maximum energy to be supplied to the antennas by matching the impedance of the supply with that of the antennas.

The plasma generating part which plays a role in producing plasma including plasma ions from gases (or a gas) comprises a gas inlet port, a gas outlet port, an inlet valve and an outlet valve which regulates the inner pressure thereof. The plasma generating part generates plasma from gases introduced through the gas inlet port with the high frequency power supplied into the antenna container. The plasma generating part has several sides of which at least one is defined by the neutral particle beam generating part. In addition, a bias voltage is applied to at least one side of the plasma generating part to accelerate and direct the generated plasma ions toward the neutral particle beam generating part. The shape of the plasma generating part is, but not limited thereto, preferably cylindrical. In addition, it is preferable that the ratio of the diameter to the height is no less than 4.

The neutral particle generating part located below the plasma generating part is equipped with at least one metal plate having multiple penetrating holes therein. The metal plate is comprised or coated with a metal whose atoms are substantially heavier than the atoms of the gas introduced into the plasma generating part. Upon colliding with the metal plate, at least some portion of a number of plasma ions, are transferred into neutral particles to form hyperthermal neutral particles.

Although the number of the metal plate in the neutral particle generating part is preferably 2~4, but not limited thereto. The penetrating holes formed on each metal plate can be formed in an equal size, but it is desirable to be formed unequally. Especially, it is desirable that the metal plate arranged farer from the plasma generator has smaller penetrating holes. In addition, in order to improve the directionality of the neutral particles, two metal plates located at a lower part can be overlapped so that the penetrating holes formed on one metal plate has the same pattern and correspond with those of the other metal plate.

The first deflecting device is desirably located across the neutral particle generating part. It plays a role in deflecting the progress direction of the plasma ions and increasing the collision number of the ions with the metal plates. Thus, the productivity of the neutral particles can be increased.

The neutral particles produced in the neutral particle generating part move to the treating part through the penetrating holes formed on the metal plate. A target holder to load the target to be treated is installed inside the treating part. The second deflecting device is desirably located across the treating part in order to deflect the plasma ions that were not transferred into neutral particles so that they do not reach to the target in the treating part.

Referring to the appended drawings, the present invention will be described in more detail.

FIG. 1 shows an exemplary embodiment of the etching apparatus according to the present invention. The etching apparatus described in the FIG. 1 is comprised of a conductive material, for example, aluminum in which the surface thereof is positively oxidized and composed of a plasma chamber having cylindrical shape 100. According to this embodiment, the chamber 100 is divided into an antenna container 120 and a main container 140 by an antenna supporting panel 110. In this example, although the antenna container 120 and the main container 140 are separated by the antenna supporting panel 110, they are connected each other by outer vacuum induction units 128, 212, 146, 226. The antenna supporting panel 110 is formed of the dielectric material, such as quartz and alumina. The main container 140 is divided into the plasma generating part 142 and the treating part 148 by the neutral particle generating part which comprises a reflecting panel assembly 150.

In the antenna container 120, high frequency antennas 122 having looped or spiral shape is installed at the upper surface of the antenna supporting panel 110. The high frequency antennas 122 is connected to the high frequency power supply 200 through a RF feed-through 124 positioned across the upper portion of the chamber 100. The high frequency power supply 200 produces several hundreds kHz to several hundreds MHz high frequency power and supplies into the antennas 122 through the impedance matching circuit 202. The matching circuit 202 make it possible to supply maximum energy to the antennas 122 by matching the impedance of the power supply 200 with that of the antennas 122.

The antenna container 120 comprises the first outlet port 128 at a side wall, and the first outlet port 128 is connected to the first outlet valve 212, such as needle valve or leak valve. When the etching apparatus operates, the first exhaust pipe 128 sucks and exhaust an air existing inside the antenna container 120 and keeps the antenna container 120 to a reduced pressure, for instance, tens or hundreds mTorr of pressure. As the atmosphere of the antenna container 120 maintains the reduced pressure, the possibility of plasma production is lower in the antenna container 120 and the deterioration of the antennas by plasma is prevented. Also, the antenna container 120 comprises the first gas inlet port 126 to which the first inlet valve 210 is connected. The inner pressure of the antenna container 120 is controlled by air supply through the first inlet valve 210 and air exhaust through the first outlet valve 212.

According to another preferred embodiment of the present invention, the antenna container 120 can be filled with gases such as oxygen, argon or halogen atoms instead of air. In this case, a gas supply is connected to the first gas inlet port 126 to introduce such gases. The antenna container 120 can be also used at the atmospheric pressure state using air.

The reflecting panel assembly 150 converts the plasma ions generated from the processing gas by the electric power supplied into the antennas 122 into neutral particles and supplies neutral particles to the treating part 148. It will be mentioned later that the reflecting panel assembly 150 is composed of one or more reflecting panels with a number of holes. Such a reflecting panel assembly 150 is assembled by inserting the reflecting panels into flanges 102 and 104 arranged on the upper chamber which defines the antenna container 120 and the plasma generating part 142, and arranged on the lower chamber housing which defines the lateral side and bottom of the treating part 148 with bolts and nuts.

Preferably, the ratio of the inner diameter to the height of the plasma generating part 142 has no less than 4. The second gas inlet port 144 is located at the side wall of the plasma generating part 142 and the gas supply 220 which supplies the processing gas is connected to the second gas inlet port 144 through the mass flow controller (MFC) 222. And the second outlet port 146 is located at the side wall of the plasma generating part 142. The second outlet valve 226 composed of the needle valve or leak valve is connected to the second outlet port 146. The second outlet valve 226 as well as the first outlet valve plays a role in regulating the pressure difference between the antenna container 120 and the plasma generating part 142. Outside the reflecting panel assembly 150, the first magnetic units 170 and 172 are configured to deflect the progressing direction of the plasma ions by applying the magnetic force to the plasma ions passing through the reflecting panel assembly 150. The first magnetic units 170 and 172 include many magnets arranged N poles and S poles alternatively.

At the lower portion of the treating part 148, there is housed a target holder 180 having roughly cylinder or disk shape to load a wafer. A target holder 180 is supported at the bottom of the chamber 100 by the elevating axis 182 which extends to the elevating device (not shown) Since a target holder 180 can move up and down along the elevating axis 182 by the operation of the elevating apparatus, it can carry in the wafer to be newly processed and carry out the processed wafer. A motor (not shown) to rotate the target holder 180 is installed at the lower part of the target holder 180. In consequence, the rotation of the target holder can prevent forming a blind spot caused by the local introduction of the neutral particles into the surface of the wafer, therefore, ensure the neutral particles to be evenly introduced into the whole surface of the wafer.

The third outlet port 190 is arranged at the bottom or at the side wall of the treating part 148. The third outlet valve 230 is connected to the third outlet port 190. At the beginning of the etching process, the third outlet valve 230 outgases the air inside the main container 140 so that it maintains the main container 140 to the vacuum state, for example, $1 \times 10^{-6}$ Torr. In addition, the third outlet valve 230 exhausts the effluent gas produced inside the main container 140.

Figure 2:
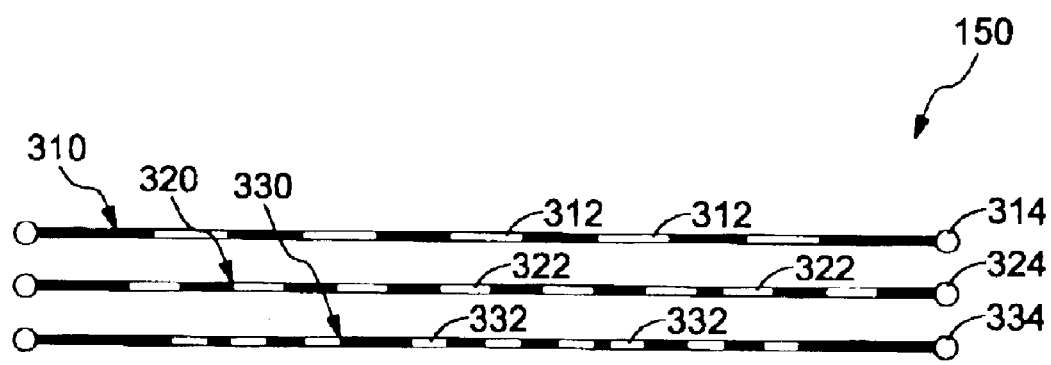
FIG. 2 is an enlarged view of the reflection panel assembly.
Figure 3:
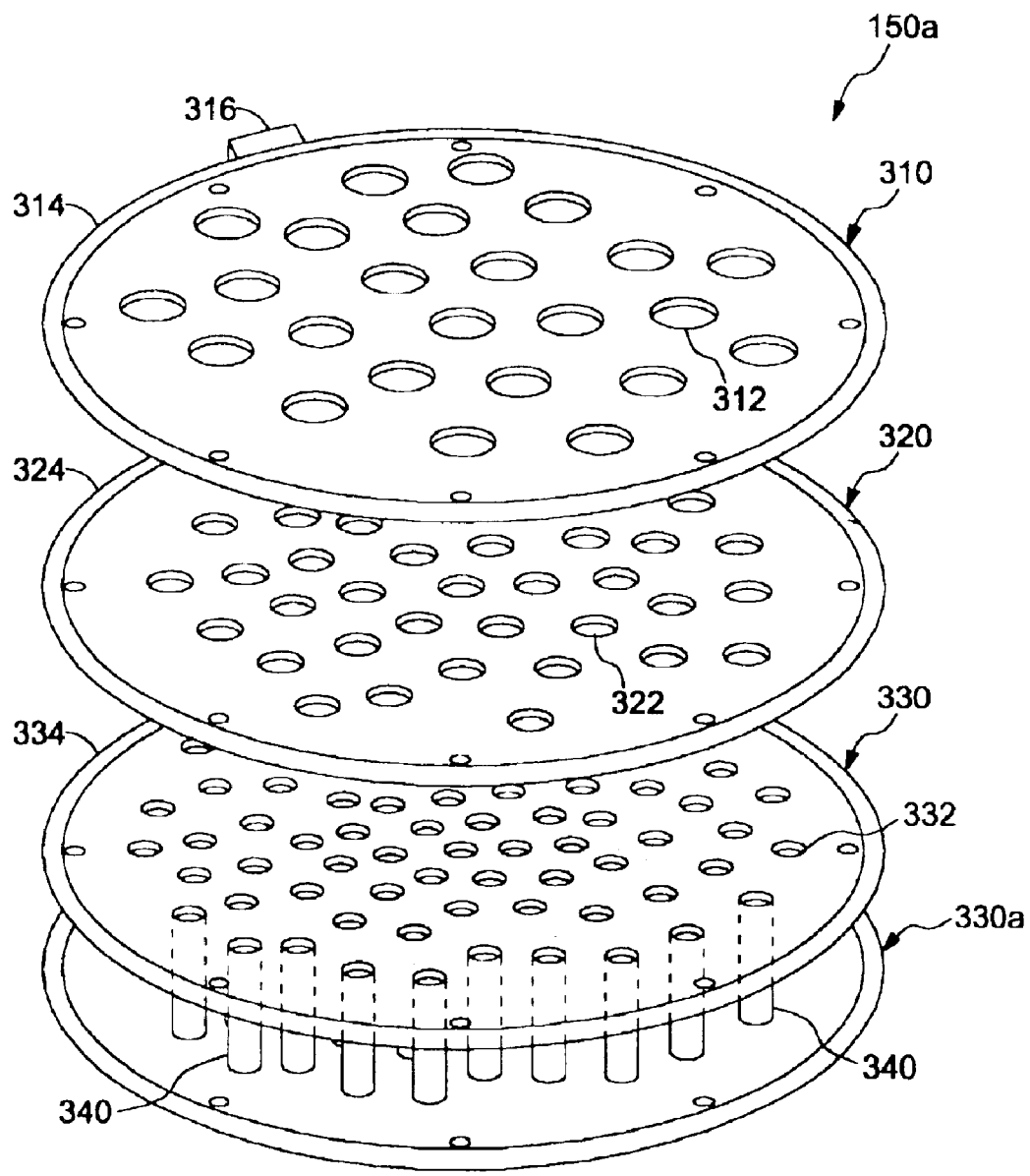
FIG. 3 is the resolved view of the reflection panel assembly.

FIGS. 2 and 3 show the reflecting panel assembly 160 depicted in FIG. 1 in detail. According to the preferred embodiment, the reflecting panel assembly 150 is composed of three reflecting panels 310, 320 and 330. Multiple penetrating holes 312, 322 and 332 are formed on each reflecting panel. Also, the cooling pipes 314, 324 and 334 with O-ring shape are installed on the circumference of each reflecting panel. These cooling pipes 314, 324 and 334 are connected to the temperature controller, which is not shown on the drawings. It is possible to remove the heat produced during the generation of neutral particles, and to keep the reflecting panels 310, 320 and 330 at low temperature by circulating the refrigerant such as water or ethylene glycol within the cooling pipes.

While the penetrating holes 312, 322 and 332 formed on each reflecting panel 310, 320 and 330 may have the same diameter, it is preferable that the diameter of the holes 322 formed on the second reflecting panel 320 is smaller than that of the holes 312 formed on the first reflecting panel 310. In the same manner, it is desirable that the diameter of the holes 332 formed on the third reflecting panel 330 is smaller than that of the holes 320 formed on the second reflecting panel 322. However, the transparency, the percentage of hole area on each reflecting panel, is possibly same as about 40~50%. Meanwhile, at least a bias terminal 316 is formed on the first reflecting panel 310 in order to attract and direct the plasma ions. Such reflecting panels 310, 320 and 330 are comprised or coated with of a heavy metal such as tantalum (Ta), molybdenum (Mo), tungsten (W), gold (Au), platinum (Pt) or alloy thereof. Each reflecting panel may be comprised of different materials.

The etching apparatus depicted in FIG. 1 operates as follows:

First, the first outlet valve 212 is operated to maintain the antenna container 120 to the reduced pressure, for example, to about tens or hundreds millitorr (mTorr). Preferably, the second outlet valve 226 is concurrently operated to prevent the damage of the antenna supporting panel 110 due to the enlarged pressure difference between the antenna container 120 and the plasma generating part 142. As a next step, the third outlet valve 230 is operated in order to keep the main container 140 to a vacuum, for example, to $10^{-6}$ Torr. The processing gas is then supplied into the plasma generating space 142 by manipulating the mass flow controller 222 and the second inlet valve 224. As a processing gas, both single gas such as argon, oxygen, or fluorine-containing molecules or hydrogen peroxide ($H_2O_2$) and a combination of two or more gases such as argon+oxygen or argon+hydrogen peroxide may be used.

When the processing gas is introduced into the plasma generating space 142, high frequency power is supplied to the antennas 122, thereby transferring the processing gas into plasma by glow discharge. In addition, the induced current by the produced plasma maintains the generation of the plasma as long as the processing gas is supplied from the gas supply 220 and the electric power is supplied into the antennas 122.

During the plasma is produced, the first reflecting panel 310 in the reflecting plate assembly 150 is grounded to the earth or applied to a bias voltage of from minus tens to minus hundreds volt. The plasma ions, which are directed to the first reflecting panel 310, are accelerated and collide with the reflecting plate assembly 150. Since the reflecting plate assembly 150 is comprised of the metal with a high molecular weight, some of the plasma ions lose a certain amount of energy and pick up electrons from the metal plate of the reflecting plate assembly 160 and transfers to neutral particles on undergoing the perfect elastic collision with the reflecting plate assembly 150. In general, it is known that the conversion probability amounts to about 70% and plasma ion loses about 50% of its energy when a ion collides with a reflecting panel (Refer to "Reflection of Plasma Ions from Metals" by John William Cuthbertson issued from The Princeton University in 1991).

Figure 4:
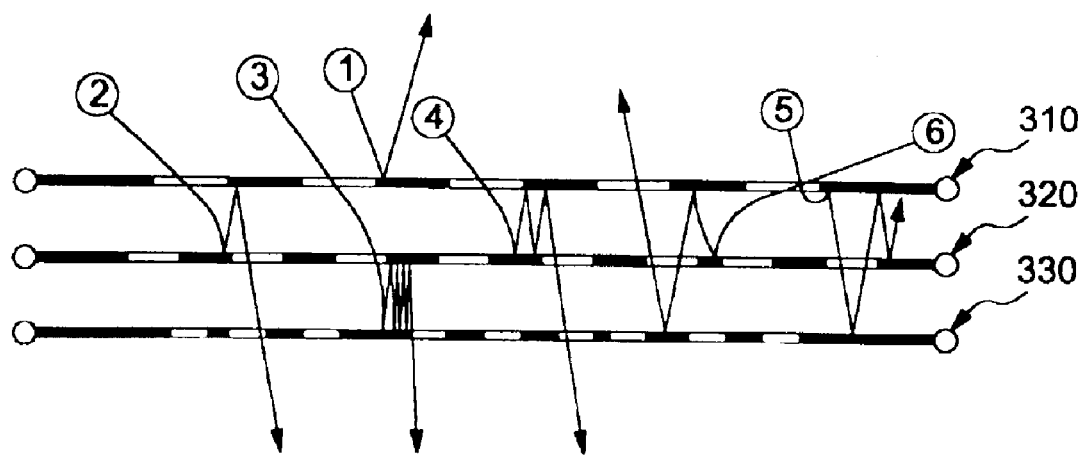
FIG. 4 is a schematic view which explains the process for producing neutral particle beams on the reflection panel assembly.

As shown in FIG. 4, some of the plasma ions are transferred into neutral particles (particle 1) through the first collision with the first reflecting panel 310, and some are converted to neutral particles (particle 2 or particle 3) between the first to the third reflecting panel. That is, plasma ions, which have passed through the first reflecting panel 310, have a chance to be neutralized at the second and third reflecting panels 320, 330, as thus, the flux of neutral particles can be increased. The neutral particles transferred are directed to the treating part 148.

The neutral particles for example, particle 1 and 6 may be introduced back into the plasma generation space 142. They may undergo the repeated elastic collisions with inside walls of the plasma generating space 142 and finally flow into the treating part 148. Once plasma ions are transferred into neutral particles, they lose about 10% of energy per collision. The neutral particle beam generated from the apparatus according to the present invention is a hyperthermal neutral beam having a high energy of ~10 eV on average.

During the conversion into the neutral particles takes place, the first magnets units 170 and 172 located at outside the reflecting assembly 150 impart the magnetic force to the plasma ions which are not transferred into the neutral particles, and deflect the plasma ions processed perpendicularly to the reflecting panel such that the plasma ions have another chance to be neutralized by colliding with the next reflecting panel. On the other hand, the second magnets units 174 and 176 prevent the plasma ions that are not transferred into neutral particles from reaching to the target located in the treating part 148.

The active species like fluorine from the neutral particle generating part chemically reacts with the material to be etched, and evaporates of itself. The neutral particle beams hardly causes any damage on the wafer because they are not charged ones. During etching takes place, the effluent gas is exhausted outside through the second outlet port 190 and the second out let valve 230.

The above embodiments are provided for illustrating the present invention, and they should not be construed to limit the scope of the present invention. Various modification or change can be made within the scope and spirit of the invention.

For instance, although only the first reflecting panel 310 is biased to accelerate the plasma ions, we also apply a bias voltage to the second reflecting panel 320 or the third panel 330, or to all of them. A bias voltage with opposite polarity can be also applied from the lower surface of the antenna supporting panel 110 rather than the reflecting panel. On the other hand, the side wall of the chamber could be biased positively or negatively. In this case, the plasma ions are axially accelerated and converted to the neutral particles.

Once the plasma ions was transferred into the neutral particles, they are not affected by the bias, they undergo repeated collisions with the internal surface of the plasma generating part, pass through the reflecting panel assembly 150, and reaches to the surface of the wafer to be treated.

According to the preferred embodiment of the present invention, the first magnetic units 170 and 172 are installed across the reflecting panel assembly 150 in order to give additional chances to collide with the reflecting panel and to be neutralized. Other deflecting units can also be employed to change the progressing direction of the plasma ions. Other deflecting device like the second magnetic units 174 and 176 and bias circuit to change the progressing direction of the plasma ions, which pass through the reflecting panel assembly 150 and head to the wafer, can be used together.

In the above, there is described that only reflecting panels 310, 320 and 330 defining an lower side of the plasma generating space 142 are made of a heavy metal with a high molecular weight, such as tantalum (Ta), molybdenum (Mo), tungsten (W), gold (Au), platinum (Pt), stainless steel or alloy thereof. However, other sides of plasma generating part 142 could be coated with such a heavy metal or be deposited with heavy metal plate.

Further, although the above description is focused on the etching apparatus, the apparatus according to the present invention can be also applicable to other semiconductor processing apparatus. Here, the "semiconductor processing" includes various kinds of processes for forming an semiconductor layer, insulating layer and/or conductive layer on an target such as the semiconductor wafer or the liquid crystal display in a predetermined pattern, thereby enabling the structural bodies to be formed by wiring, electrode connected to the semiconductor apparatus. As an example of the semiconductor processing, etching, ashing, formation of the oxidized film and cleaning can be mentioned.

The kind of the gas supplied form the gas supply 220 might also be changed according to the specific process. For instance, provided that the active species gases are supplied from the gas supply 220, if one wishes to etch a target, especially, $SiO_2$ used as an insulating material, the fluorine-containing gas would be preferably used. In ashing, cleaning or formation of the oxidized film, oxygen could be supplied as an active species gas.

Although antennas having looped or spiral shape are mentioned for a high frequency antenna 122, antennas wounded around the chamber or other shape of antennas could be also employed. Further, with regard to the type for supplying current to plasma generating space 142 through the high frequency antenna 122, the capacitively coupled type can be applied other than inductively coupled type, or mixed type can be also applied. Alternatively, the current can be supplied through waveguide. Moreover, the antennas could be located inside the chamber at a position facing to the target to be treated. Of course, since the antennas according to the preferred embodiment are positioned inside the chamber, the system described can be regard to be one adopting an internal antenna.

In the preferred embodiment, three reflecting panels 310, 320 and 330 constituting the reflecting panel assembly 150 are described as a preferable example. But, it should be understood that the number of the reflecting panel is not limited thereto. Preferably, the reflecting panel assembly has two or more reflecting panels. More preferably, the reflecting panel assembly has two to four reflecting panels. The more reflecting panels are used, the less the average energy of which neutral particles has. Therefore, the number of the reflecting panels can be selected such that the incidence angel of neutral particle, anisotropic etching requirement and the particle energy can be maximally adjusted. Further, it is exampled that the penetrating holes formed on the reflecting panel is circular, but not limited thereto. Rectangular, slits with fan shape cross section may also be used.

As the ratio of the diameter to the depth of the hole formed on the reflecting panels gets smaller, the incidence angle of the hyperthermal neutral particles to the wafer is closer to perpendicular. However, manufacturing the reflecting panel gets more difficult as the diameter-depth ratio gets smaller. Regarding these facts, one can select the ratio of the diameter to the depth such that the reflecting panel assembly 150 can be arranged to a suitable shape. For Instance, for the third reflecting panel 330 located at the lower end of the reflecting panel assembly 150, can be overlapped with at least one equal reflecting panel so that they next to each other in contact and the holes 340 are correspond to each other.

FIG. 3 shows such a reflecting panel assembly 150. In the reflecting panel assembly 150 as shown in FIG. 3, the neutral particles entering the holes of the third reflecting panel 330 with a inclined direction instead of a perpendicular direction are reflected on the fourth reflecting panel 330a and their moving direction is changed. Then, they progress in a roughly perpendicular direction and possibly reach to the wafer loaded on the target holder 180.

As mentioned above, the neutral particles are produced by the collision of plasma ions with the reflecting panel assembly comprising one or more reflecting panels. This system facilitates high density of neutral particles to be obtained throughout the wide area in low pressure with simple and cheap structure.

In addition, because the apparatus according to the present invention treats the surface of the target with neutral particles rather than plasma ions, the probability to damage the target could be reduced to a remarkably low level. In addition, the apparatus according to the present invention makes it possible to achieve a uniform treatment by uniformly distributed neutral particle beams with the aid of the reflecting panel assembly forcing the plasma ions to be progressed downwards and the multiple penetrating holes formed on the reflecting panel. Further, it can improve the productivity as even large wafer can be processed with high speed.

In addition, since the plasma ions are accelerated in the plasma generating space prior to the neutral particles are formed, high frequency bias need not to applied to the target holder or susceptor, compared to the plasma apparatus. Moreover, the apparatus according to the present invention has another advantage that the reflecting panel assembly is replaced easily when it is damaged by the collision thereof with the plasma ions or the neutral particles since it can be combined to the chamber with the volts and nuts.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An apparatus for treating the surface with neutral particle beams, comprising:

a) an antenna container which comprises an antenna supporting panel by which antennas connected to a high frequency power supply through a RF feedthrough are supported, an air inlet port, an air outlet port, an air inlet valve and an air outlet valve;

b) a plasma generating part which comprises a gas inlet valve and a gas outlet valve regulating the inner pressure thereof, a gas inlet port and a gas outlet port, and which transfers a gas introduced through the gas inlet port into plasma ions with high frequency power supplied from the high frequency power supply;

c) a neutral particle generating part located below the plasma generating part, which comprises at least one metal plate having multiple penetrating holes therein and comprised of or coated with a metal whose atoms are substantially heavier than the atoms of the gas introduced into the plasma generating part, and which transfers the plasma ions generated in the plasma generating part into neutral particle beams by the collision of the plasma ions with the metal plate; and, d) a treating part below the neutral particle generator, which comprises a target holder to load a target to be treated and an exhaust pipe, and into which the target is treated with the neutral particles generated in the neutral particle generating part, wherein, the antenna container and the plasma generating part are interconnected by outer vacuum induction units comprised of the air outlet port, the air outlet valve, the gas outlet port and the gas outlet valve such that the deterioration of the antennas by plasma is prevented.

2. The apparatus as set forth in claim 1, further comprising a means for maintaining the antenna container at a predetermined reduced pressure.

3. The apparatus as set forth in claim 1, wherein the neutral particle generating part further comprises a deflecting device that deflects the progressing direction of the plasma ions such that the collision of the plasma ions with metal panel is increased.

4. The apparatus as set forth in claim 1, wherein the treating part further comprises a deflecting device that deflects the progressing direction of the plasma ions such that the plasma ions are not reached to the surface of a target to be treated.

5. The apparatus as set forth in claim 1, wherein a bias voltage is applied to the neutral particle generating part to accelerate the plasma ions generated in the plasma generating part.

6. The apparatus as set forth in claim 1, wherein the neutral particle generating part comprises two or more metal plates in which the first metal plate is located next to the plasma generating part and the others are located below the first metal plate.

7. The apparatus as set forth in claim 1, wherein the metal comprised of the metal plate is selected from the group consisting of tantalum, molybdenum, tungsten, gold, platinum and alloy thereof.

8. The apparatus as set forth in claim 1, wherein the size of the penetrating hole formed on the first metal plate is smaller than that of the hole formed on the second metal plate.

9. The apparatus as set forth in claim 1, wherein the inner cross section of the plasma generating part is a substantially cylindrical shape, the ratio of the diameter of the plasma generating part to the height is no less than 4.

10. The apparatus as set forth in claim 1, wherein the gas introduced in the plasma generating part is selected from the group consisting of argon, oxygen, fluorine-containing gas, hydrogen peroxide and mixture thereof.

11. The apparatus as set forth in claim 1, wherein the target holder to load a target is rotating.

* * * * *